(12) United States Patent
Franz et al.

(10) Patent No.: US 12,314,095 B2
(45) Date of Patent: May 27, 2025

(54) FLUID COUPLINGS WITH MAGNETIC LATCH ASSEMBLY

(71) Applicant: HEWLETT PACKARD ENTERPRISE DEVELOPMENT LP, Spring, TX (US)

(72) Inventors: John Paul Franz, Tomball, TX (US); Harvey John Lunsman, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 230 days.

(21) Appl. No.: 18/161,937

(22) Filed: Jan. 31, 2023

(65) Prior Publication Data
US 2024/0256011 A1    Aug. 1, 2024

(51) Int. Cl.
*H05K 7/20* (2006.01)
*F16L 37/00* (2006.01)
*F16L 37/096* (2006.01)
*G06F 1/20* (2006.01)

(52) U.S. Cl.
CPC ............. *G06F 1/20* (2013.01); *F16L 37/004* (2013.01); *F16L 37/096* (2013.01); *H05K 7/20272* (2013.01); *H05K 7/20709* (2013.01)

(58) Field of Classification Search
CPC .... G06F 1/20; G06F 2200/201; F16L 37/004; F16L 37/096; H05K 7/20272; H05K 7/20327; H05K 7/20709
See application file for complete search history.

(56) References Cited

U.S. PATENT DOCUMENTS

| | | | |
|---|---|---|---|
| 7,311,526 B2 | 12/2007 | Rohrbach et al. | |
| 9,124,031 B2 | 9/2015 | Su et al. | |
| 9,425,543 B2 | 8/2016 | Sprenger et al. | |
| 10,080,703 B2 | 9/2018 | Carrel et al. | |
| 2011/0234035 A1 | 9/2011 | Wittschier | |
| 2013/0341917 A1* | 12/2013 | Lehmann | F16L 37/248 285/402 |
| 2016/0066480 A1* | 3/2016 | Eckberg | F16L 37/34 361/679.53 |
| 2017/0127575 A1* | 5/2017 | Lunsman | H05K 7/20263 |
| 2017/0182306 A1 | 6/2017 | Swantner | |
| 2018/0131128 A1 | 5/2018 | Franz et al. | |
| 2019/0115691 A1* | 4/2019 | Johnson | H01R 13/6205 |

* cited by examiner

*Primary Examiner* — Jacob R Crum
(74) *Attorney, Agent, or Firm* — Jones Robb PLLC

(57) ABSTRACT

A pair of fluid couplings for liquid cooling electronic devices comprises a first fluid coupling and second fluid coupling. The first fluid coupling comprises a female coupling interface and the second fluid coupling comprises a male coupling interface to couple with the female coupling interface. Each of the fluid couplings comprises a magnetic latch assembly coupled to the coupling interface thereof. Each magnetic latch assembly comprises a shell, magnets housed within the shell, and a group of ramp-and-hook latches coupled to the shell. The magnets cause the magnetic latch assemblies to magnetically attract one another during coupling, reducing the force a user may need to apply to complete the coupling. The ramp-and-hook latches of one magnetic latch assembly are complementary to the ramp-and-hook latches of the other magnetic latch assembly, and they are arranged to engage with one another and interlock when the first and second fluid couplings are coupled.

10 Claims, 7 Drawing Sheets ized as well. Accord- ingly, liquid cooling systems for new generations of com-

FLUID COUPLINGS WITH MAGNETIC LATCH ASSEMBLY

INTRODUCTION

Electronic devices, such as computers, networking devices, power supply units, etc., generate heat when in use. Cooling systems may be utilized to remove heat from components of the electronic devices to keep them within desired operating temperatures. For example, liquid cooling techniques may use flows of liquid coolant to remove heat from the system. In such liquid cooling techniques, a cold plate thermally coupled with the electronic device and with the flow of liquid coolant can be used to transfer heat from the electronic device to the liquid coolant.

In systems that utilize liquid cooling techniques, the flows of liquid coolant are delivered to the electronic devices via liquid cooling infrastructure such as pumps, coolant lines, fluid couplings, etc. In particular, quick-disconnect (QD) fluid couplings are commonly used to connect tubes or pipes to other components, such as another tube or pipe, a fluid manifold, a pump, or other infrastructure.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings.

DETAILED DESCRIPTION

Figure 1:
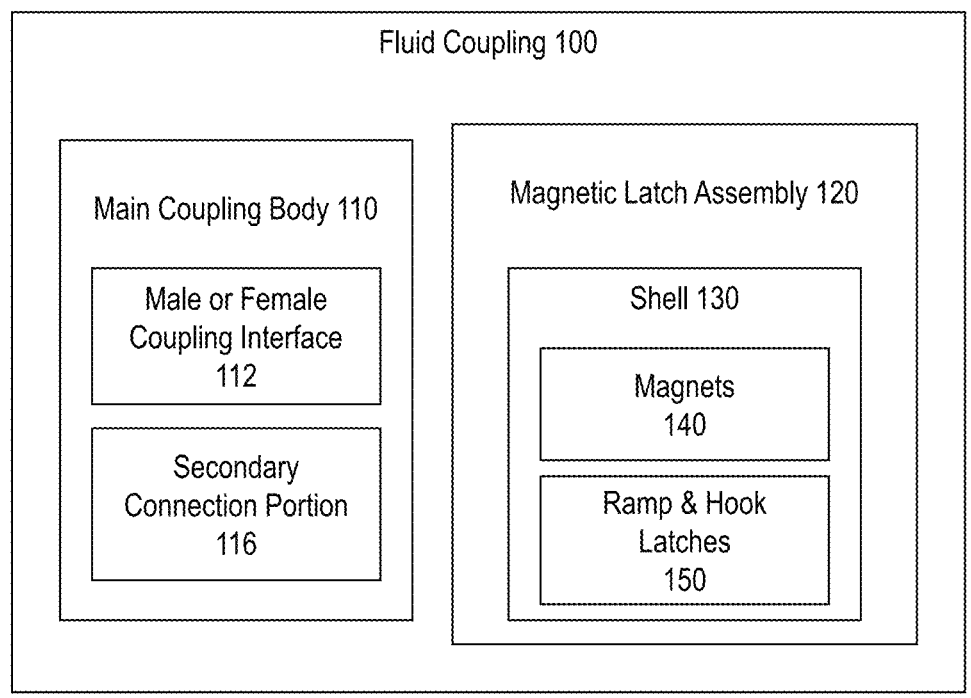
FIG. 1 is a block diagram illustrating an example first fluid coupling.

As computing devices increase in performance, the heat generated thereby also tends to increase as well. Accordingly, liquid cooling systems for new generations of computing devices are expected to need greater cooling capacity, and in particular greater liquid coolant flow rates. To allow for greater flow rates, larger diameter tubes/pipes and larger diameter fluid coupling may be needed.

However, one problem with using larger diameter fluid couplings is that the larger diameter fluid couplings can require a relatively large amount of force to couple together, especially if the coolant lines are pressurized at the time of coupling. For example, some fluid couplings that can produce the desired increased flow rate may need to be pushed together with around 30-50 lbs (133-222 N) of force to complete the coupling thereof, assuming the coupling is performed while the lines are pressurized at typical pressures used in liquid cooling systems (e.g., about 30 psi (2.1 bar)). This represents a 3-4 fold increase on the amount of force typically needed for fluid couplings in various existing designs. Of this force, around 20-40 lbs (89-178 N) may be attributable to the internal spring forces of the springs that hold poppets/valves of the couplings closed, and around 10-20 lbs (44-89 N) may be attributable to the pressure of the liquid in the lines. In many cases, the coupling of the fluid couplings needs to be performed manually by a person, but many people might not be strong enough to push the couplings together with 30-50 lbs (133-222 N) of force. Moreover, even if a relatively strong user is able to couple these fluid couplings together, if many couplings are needed then even a strong user can easily become fatigued (e.g., some systems have dozens of such couplings). While depressurizing the system can reduce the force that is needed to couple the couplings, in many cases (e.g., during repairs and/or upgrades of existing systems) the system may need to remain pressurized so that liquid cooling can continue and the system can remain functional, and thus the force needed while pressurized remains an important limiting factor for fluid couplings.

To reduce the amount of force that a user may need to supply to couple the fluid couplings, examples disclosed herein provide the fluid couplings with complementary magnetic latch assemblies that generate magnetic attraction forces that aid the user in completing the coupling. The magnetic latch assemblies comprise magnets, such as magnet segments of alternating polarity arranged in a ring around the main body of the coupling. The magnets of one magnetic latch assembly are attracted to the magnets of the other magnetic latch assembly, and the forces generated thereby may offsets some or all of the required coupling force, making it much easier for a user to couple the fluid couplings together.

In some examples, the magnetic latch assemblies for the fluid couplings comprise a shell that houses the magnets, which is formed separately from and then mounted to a main body of the fluid coupling. This formation of the magnetic latch assembly separately from the main body of the coupling can allow for reduced manufacturing costs. For example, in some cases the main body of the fluid coupling is formed from relatively expensive materials (e.g., stainless steel, brass, or other metals) and relatively expensive processes (e.g., machining), whereas the shell of the magnetic latch assembly can be formed from relatively inexpensive materials (e.g., plastic) and relatively inexpensive processes (e.g., injection molding or additive manufacturing (3D printing)). In addition, the separation of the main body from the magnetic latch assembly can allow for the main body to be used for making both fluid couplings that do not utilize magnets (e.g., by using the main body without the magnetic latch assembly) and the fluid couplings described herein that do (e.g., by adding the magnetic latch assembly to the main body). This allows for reduced tooling and lower manufacturing costs. In addition, in some cases the magnetic latch assembly can be added to existing fluid couplings, allowing for the retrofitting of these existing couplings.

In some examples, magnetic latch assemblies for the fluid couplings comprise complementary latching structures that engage with one another to hold the couplings in a coupled state. This can help to ensure that the couplings do not inadvertently decouple, especially in those examples in which the magnetic attraction force is equal to or less than the internal forces urging separation (e.g., the spring forces and liquid pressure). Each of these latching structures comprises a hook feature and a ramp feature, and thus may be referred to herein as a ramp-and-hook latch. The hooks of one coupling are complementary to those of the other, and these hooks interlock to latch the two fluid couplings together. Moreover, the shells of the magnetic latch assemblies are configured to hold the magnets thereof in predetermined positions so that the magnetic attraction forces between the magnets cause the magnetic latch assemblies to automatically self-align relative to one another. This can aid the user in securing the latches as the hooks of one magnetic latch assembly are automatically aligned with the hooks of the other magnetic latch assembly. This also helps to keep the hooks engaged with one another after coupling has been completed, thus aiding in prevention of inadvertent decoupling.

The ramps of the latching structures can aid the user with decoupling of the fluid couplings. To allow for decoupling the fluid couplings, in some cases the fluid couplings can be rotated to misalign the magnets, thereby reducing the magnetic attraction forces therebetween or even generating repulsion forces if rotated far enough. However, in some cases the friction and magnetic attraction forces may make it relatively hard to rotate the couplings sufficiently to allow for decoupling. But in examples disclosed herein, the ramps may engage with and slide by one another as the couplings are initially rotated and, like the threads of a screw, begin forcing the fluid couplings to move apart from one another in response to the rotation. Although the translation induced by the ramps is relatively small—for example, on the order of a few millimeters—this separation may be sufficient to greatly reduce the influence of the magnets resisting rotation and hence the amount of torque the user needs to apply to the fluid couplings. For example, with a 1 mm air gap between the magnets, it can take 325 mN·m of torque to rotate the couplings through a given angle, whereas with an air gap of 4 mm the needed torque to rotate the couplings through the same angle is lowered to 150 mN·m. Thus the ramps, by forcing a slight separation between the couplings as rotation begins, can reduce the torque needed for the further rotation that will ultimately allow for the couplings to separate.

These and other examples will be described in greater detail below in relation to FIGS. 1-17.

FIG. 1 illustrates an example fluid coupling 100. The fluid coupling 100 may comprise, for example, a QD fluid coupling which can be used in a liquid cooling loop for cooling an electronic device. The fluid coupling comprises a main coupling body 110 and a magnetic latch assembly 120 coupled to the main coupling body 110.

The main coupling body 110 has a generally tubular shape with a central cavity defining a path through which liquid can flow. In some examples, the main coupling body 110 comprises a strong material, such as a metal (e.g., stainless steel, brass, or other metals). In some examples, the main coupling body 110 may be similar to various existing QD fluid couplings. In particular, the main coupling body 110 comprises a coupling interface 112 and a secondary connection portion 116. The coupling interface 112 comprises a QD interface configured to mate with a complementary coupling interface 112 of another fluid coupling 100. The coupling interface 112 is described in greater detail below. The secondary connection portion 116 is configured to connect the main coupling body 110 to a liquid carrying conduit, such as a tube, pipe, manifold, coolant distribution unit (CDU), pump, an entry port of a liquid cooled electronic device, or any other liquid cooling infrastructure. For example, the secondary connection portion 116 may comprise a hose bard connection, a threaded connection (male or female), a compression fitting, a push-to-connect fitting, a Yor-Lok fitting, an O-ring face seal fitting, a solder-connect fitting, or any other connectors/fittings. The secondary connection portion 116 is generally configured for a more permanent connection than that provided by the coupling interface 112, although both can be disconnected if needed.

Returning to the coupling interface 112, in some examples the coupling interface 112 can be male or female, and one fluid coupling 100 that has a male coupling interface 112 can couple with another fluid coupling 100 that has a female coupling interface 112. For example, one coupling interface 112 may comprise a protrusion and another coupling interface 112 may comprise a receptacle, wherein the protrusion is configured to be received within the receptacle, and the coupling interface 112 with the protrusion may be referred to herein as a male coupling interface 112 while the coupling interface 112 with the receptacle may be referred to herein as the female coupling interface 112. The coupling interfaces 112, whether male or female, may also comprise internal flow control elements (not illustrated) that prevent the flow of liquid when the coupling interface 112 is not coupled to a complementary coupling interface 112 (of another fluid coupling 100) and allow the flow of liquid when the coupling interface 112 is coupled to a complementary coupling interface 112. These flow control elements may comprise, for example, a poppet or valve that is movable between open and closed positions, with the poppet or valve blocking the liquid flow path when in the closed position and allowing liquid to flow through the path when in the open position. A spring or other similar biasing element may be coupled to the poppet or valve to bias it towards the closed position. As two of the fluid couplings 100 are coupled together, part of one coupling interface 112 may push against (or otherwise interact with) the poppet or valve of the other coupling interface 112 and move it into the open position, and thus the fluid paths through the two fluid couplings 100 are automatically opened as a result of the fluid couplings 100 being coupled together. In moving the poppets or valves to their open positions, the spring forces that hold the poppets or valves in the closed position need to be overcome, as well as forces from the pressure of the liquid pushing against the poppets or valves. QD fluid couplings and the coupling interfaces thereof are familiar to those of ordinary skill in the art, and thus the internal components of the coupling interface 112 are not illustrated or described in greater detail herein.

The magnetic latch assembly 120 comprises a shell 130 that carries the magnets 140 that provide the magnetic attraction forces described above. The shell 130 is formed separately from the main coupling body 110, and is later coupled thereto. For example, the shell 130 may have a ring-like shape with a central opening into which a portion of the main coupling body 110 may be received so that the shell 130 surrounds the main coupling body 110. The shell 130 may be formed, for example, from plastic via injection molding, additive manufacturing, or any other desired manufacturing technique.

The shell 130 further comprises a magnet compartment into which a plurality of magnets 140 are arranged. The magnets 140 may be arranged around the circumference of the shell 130 with alternating polarities. For example, if two magnets 140 are provided there may be one with a first polarity (e.g., North) and one with a second polarity (e.g., South), if fourth magnets 140 are provided there may be two with the first polarity (e.g., North) and two with the second polarity (e.g., South) arranged alternately, and so on for six, eight, or any even number of magnets 140. In some examples, each of the magnets 140 may be shaped as a segment of a ring (more specifically, a segment of a cylindrical shell or rectangular toroid), such that when all of the magnets 140 are arranged around the circumference of the shell 130 they collectively form an essentially full ring (cylindrical shell) (except for small gaps potentially left between adjacent magnets). For example, in some implementations two magnets 140 are provided that are shaped as approximately 180-degree segments of a ring. As another example, in some implementations four magnets 140 are provided that are shaped as approximately 90-degree segments of a ring. As another example, in some implementations six magnets 140 are provided that are shaped as approximately 60-degree segments of a ring. And so on for other numbers of magnets 140. In some examples, the magnets 140 may be separated from one another by ribs or other dividers, in which case the magnets 140 may have a shape of a segment that is slightly smaller than that noted above to allow for the divider (e.g., two 176-degree segments, four 88-degree segments, and so-on).

The shell 130 further comprises a plurality of ramp-and-hook latches 150. In some examples, the ramp-and-hook latches 150 are evenly distributed around a circumference of the shell 130. In some examples, the ramp-and-hook latches 150 are formed from a radially outermost wall of the shell 130. The ramp-and-hook latches 150 extend, generally, in an axial direction towards the location of where another fluid coupling 100 would be located during a coupling sequence, so that the ramp-and-hook latches 150 of one of the couplings 100 can engage with the complementary ramp-and-hook latches 150 of the other coupling 100. Each ramp-and-hook latch 150 comprises a hook feature and a ramp feature. In particular, each ramp-and-hook latch 150 comprises a somewhat saw-toothed or wave-shaped protrusion that protrudes in an axial direction from a rear portion of the shell 130 toward the opposite fluid coupling 100, and at an apex of this axial protrusion the hook feature is formed by another smaller protrusion (e.g., like the crest of the wave) that protrudes circumferentially away from the apex to define a cove or notch behind the hook. The ramp also extends circumferentially from the apex, but in the opposite direction as the hook, with the ramp sloping back from the apex towards the rear of the shell 130.

When the ramp-and-hook latches 150 of one fluid coupling 100 are engaged with the complementary ramp-and-hook latches 150 of another fluid coupling 100, the hook of each ramp-and-hook latch 150 is received within the cove defined by the opposite ramp-and-hook latches 150, and vice versa, such that the hooks interlock with one another and prevent translation of the shells 130 (and hence the two fluid couplings 100) apart from one another in the axial directions. Thus, the ramp-and-hook latches 150 can secure the fluid couplings 100 together, preventing inadvertent decoupling thereof. Moreover, because the magnets 140 of one magnetic latch assembly 120 are arranged in a complementary manner to those of the other magnetic latch assembly 120, the magnets exert forces that self-align the two magnetic latch assemblies 120 of the mating fluid couplings 100 such that the respective hooks of the engaging ramp-and-hook latches 150 are all automatically self-aligned with one another during the mating by the magnetic forces. In addition, these self-aligning magnetic forces tend to hold the hooks in interlocking engagement with one another after the coupling is complete, thus further securing the coupled fluid coupling 100 together. Moreover, because the ramp-and-hook latches 150 can secure the couplings 100 together, other latching feature that have traditionally been used in fluid couplings can be omitted, which can allow more room for other parts (such as larger magnets 140) and/or reduced costs.

In addition, when the ramp-and-hook latches 150 of one fluid coupling 100 are engaged with the complementary ramp-and-hook latches 150 of another fluid coupling 100, the ramp of each ramp-and-hook latch 150 in contact with the ramp of the opposite ramp-and-hook latches 150, and vice versa. This sloped engagement between the ramps converts rotational motion of the two shells 130 of a pair of coupled fluid couplings 100 into axial translation of the two shells 130 (and hence the fluid couplings) in opposite directions. As described above, this axial separation of the shells 130 can increase the air gap between the respective magnets 140 thereof sufficiently to allow for a noticeable decrease in the amount of torque that is needed to continue rotating the shells 130. For example, in one implementation, the torque needed to overcome magnetic resistance to rotation of the ring magnets relative to one another, for a given air gap therebetween, may start out relatively small and rapidly increase with each degree of rotation (at least up until about 20 to 30 degrees of rotation, whereupon the torque will continue to increase with each degree of rotation but at a slower rate). Moreover, the greater the air gap between the magnets, the less torque is required for the same angle of rotation. For example, ten degrees of rotation may require, in one example, 206 mN·m of torque at 1 mm separation distance, or 150 mN·m of torque at 2 mm separation, or 88 mN·m of torque at 4 mm separation. In other words, in an example, the torque required to turn the magnets 7-degrees when they have a 1 mm separation distance may be the same as the torque required to turn the magnets 10-degrees when they have a 2 mm separation distance or 20-degrees when they have a 4 mm separation distance. The ramps take advantage of these phenomena to reduce the overall torque needed to rotate the shells 130 to separate fluid couplings 100. In particular, as the shells 130 first begin to rotate, the torque needed to overcome the magnetic resistance to rotation is relatively small because the angle of rotation is small, thus during this stage the primary source of resistance to the rotation is friction between the ramps and the axial magnet attraction force that resists the axial translation caused by the ramps. However, the ramps create leverage much like a screw, and thus the friction and axial magnetic attractive forces can be relatively easily overcome with modest torque. As rotation continue through a larger angle, the magnetic resistance to rotation would normally increase rapidly if the ramps were not present, and when combined with the friction and other forces this torque may become sufficient to make continued rotation difficult for some users. However, in the examples described herein, this increase in the magnetic resistance to rotation due to increasing angle of rotation is largely offset by the increased axial separation between the magnets caused by the ramps. Recall that the torque required to rotate the magnets depends on the separation distance between the magnets, with greater separation reducing the needed torque. Thus because the ramps increasing the separation distance with each degree of rotation, they therefore also reduce the torque-per-degree. The effects of the increasing torque due to increasing angle of rotation and the decreasing of torque due to increasing separation distance tend to partially or wholly cancel one another out, greatly diminishing the effect of the magnets' resistance to rotation on the overall torque needed to rotate the shells 130.

In some examples, the ramp of one ramp-and-hook latch 150 ends (or begins, depending on perspective) within the cove defined by the hook of an adjacent ramp-and-hook latch 150, so that the plurality of ramp-and-hook latches 150 form a continuous series of ramps and hooks around the circumference of the shell 130. In some examples, the shell 130 comprises one ramp-and-hook latch 150 for each magnet 140. In other examples, the number of latches 150 is independent from the number of magnets 140. In some examples, there are four ramp-and-hook latches 150.

Turning now to FIGS. 2-14, example fluid couplings 200 and 300 will be described. The fluid couplings 200 and 300 are example configurations of the fluid coupling 100 described above and illustrated in FIG. 1. In particular, the fluid coupling 200 is an example configuration of the fluid coupling 100 with a female coupling interface, while the fluid coupling 200 is an example configuration of the fluid coupling 100 with a male coupling interface, wherein the fluid couplings 200 and 300 are configured to couple with one another. Various components of the fluid couplings 200 and 300 are similar to the components of the fluid coupling 100 described above, and these similar components are given similar reference numbers herein (e.g., numbers having the same last two digits) and duplicative description of aspects of these components already described above may be omitted. Various components of the fluid couplings 200 and 300 have similar reference numbers and these are also similar to one another, except for differences as noted below and/or as apparent in the figures.

Figure 2:
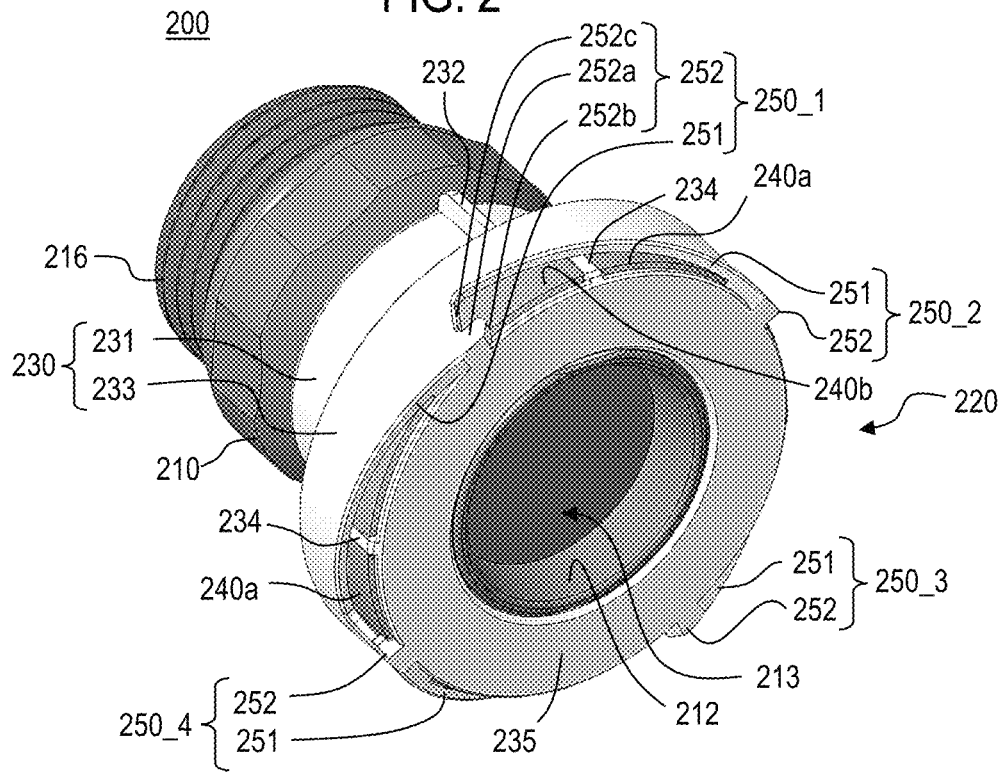
FIG. 2 is perspective view of an example second fluid coupling.
Figure 3:
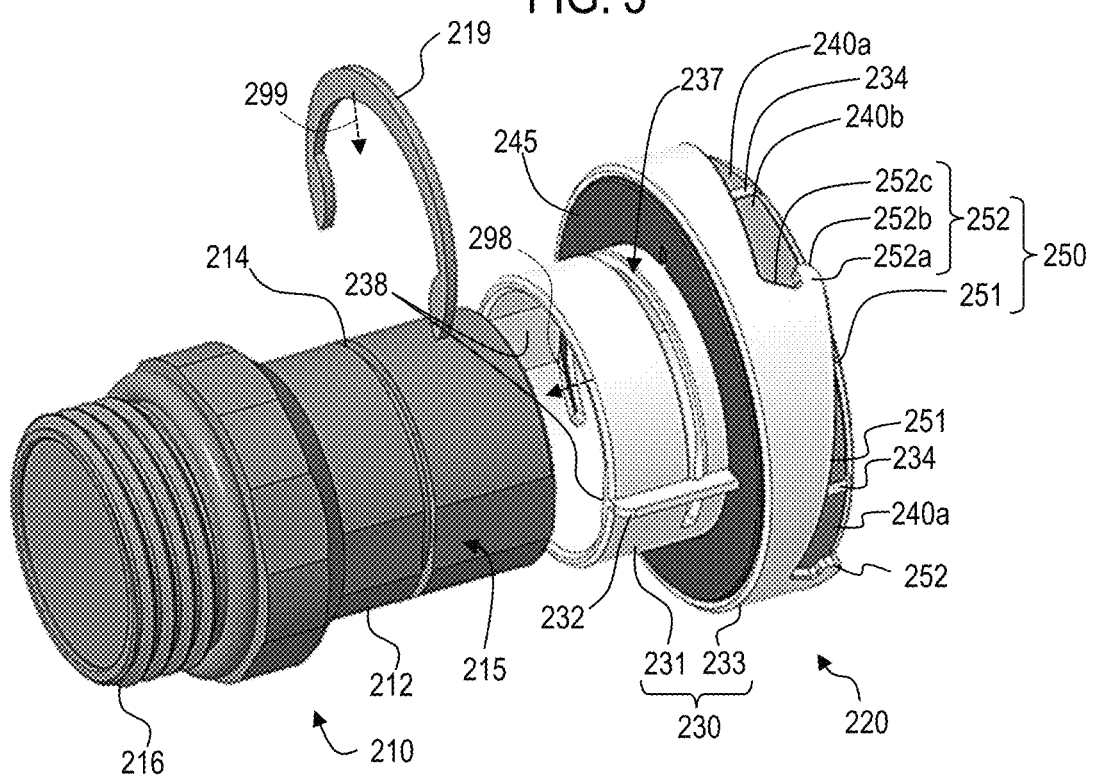
FIG. 3 is an exploded perspective view of the second fluid coupling.

As shown in FIGS. 2 and 3, the fluid coupling 200 comprises a main coupling body 210 and a magnetic latch assembly 220. The magnetic latch assembly 220 is configured to be mounted to the main coupling body 210. In particular, the main coupling body 210 comprises a female coupling interface 212 and a threaded secondary connection portion 216, and the magnetic latch assembly 220 is mounted to the female coupling interface 212 such that the magnetic latch assembly 220 is radially outward of and circumferentially surrounds the coupling interface 212. The magnetic latch assembly 220 comprises a shell 230, which has an inner cylinder 231 and a magnetic compartment 233 attached to the inner cylinder 231. The inner cylinder 231 is hollow, and the magnetic latch assembly 220 is mounted to the main coupling body 210 by moving the inner cylinder 231 in the direction 298 indicated in FIG. 3 onto the female coupling interface 215 such that the female coupling interface 215 is received within the hollow bore of the inner cylinder 231.

The magnetic latch assembly 220 is secured in this position by a fastening element, which in the illustrated example is an snap retention ring or clip 219 which is inserted in the direction 299 through a slot 237 in the inner cylinder 231 and into a groove 214 in the radially outer surface of the coupling interface 212. The snap retention ring 219 keeps the magnetic latch assembly 220 from moving axially relative to the main coupling body 210. In other examples, any other type of fastening element could be used, such as a screw, a pin (e.g., a roll pin), a clamp, friction, a snap fit attachment, adhesive, solder, heat staking, etc.

As shown in FIG. 3, in some examples, a radially outer surface of the coupling interface 212 may comprise flat surface portions 215 (only one visible in FIG. 3, but another one may be present diametrically opposite therefrom). Corresponding flat surface portions 238 may be provided on a radially inward surface of the inner cylinder 231, and these flat surface portions 215 and 238 may engage one another to prevent rotation of the main body portion 210 relative to the magnetic latch assembly 220.

Figure 4:
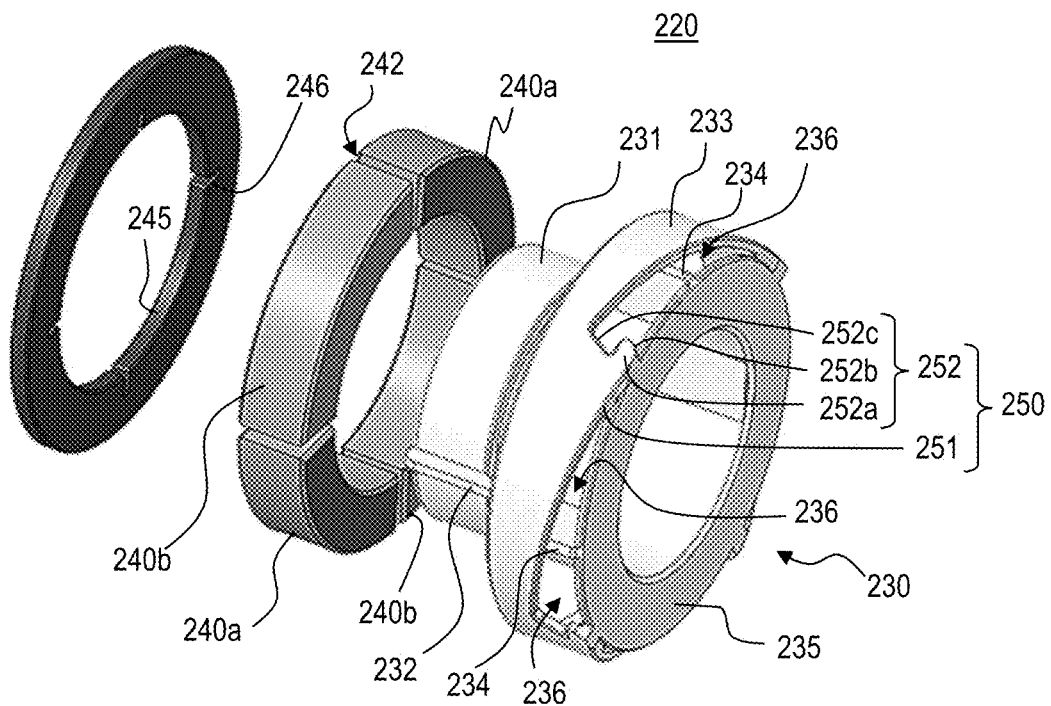
FIG. 4 is an exploded perspective view of a magnetic latch assembly of the second fluid coupling.

As shown in FIGS. 2-4, the magnet compartment 233 of the magnetic latch assembly 220 is configured to hold magnets 240. In the illustrated example, there are four magnets 240, two magnets 240a of a first polarity and two magnets 240b of a second polarity, which are arranged with alternating polarity around the circumference of the magnetic latch assembly 220. As shown in FIG. 4, the magnet compartment 233 further divided by dividers 234 into four sub-compartments 236 (only two are visible in FIG. 4). The dividers 234 may hold the magnets 240 in predetermined positions, preventing them from moving around the magnet compartment 233. This may help to ensure the proper self-alignment of the magnetic latch assembly 220 during coupling.

Figure 5:
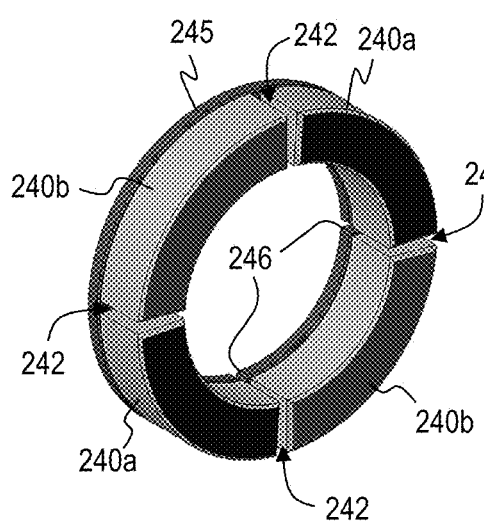
FIG. 5 is a perspective view of magnets and support ring of the second fluid coupling.
Figure 6:
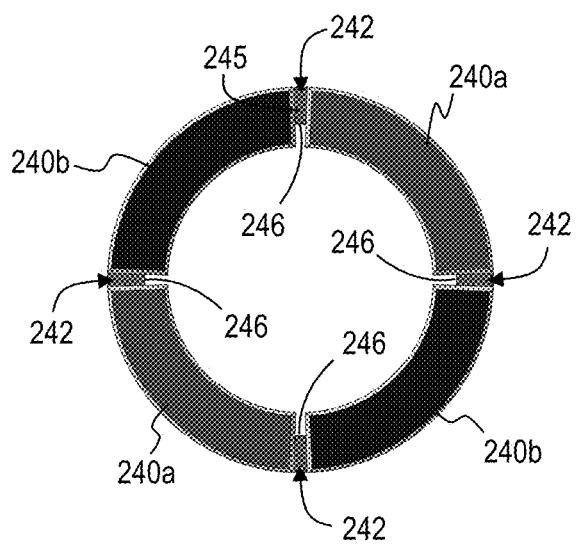
FIG. 6 is a front view of the magnets and support ring of the second fluid coupling.

As shown in FIGS. 3-5, in some examples, the magnetic latch assembly 220 also comprises a steel shunt ring 246 coupled to the rear of the magnets 240. The ring 246 increases the magnetic attractive force of the magnets 240, for example by about 15% in some cases. Moreover, the ring 246 may provide structural support to the magnets 240, which can be somewhat brittle. As shown in FIGS. 4-6, the ring 246 may have slots 246 formed therein. These slots 246 may be aligned with the gaps 242 between adjacent magnets 240. As suggested by FIG. 4, at least some of the gaps 242 and slots are aligned with ribs 232 coupled to a radially outer surface of the inner cylinder 321. These ribs 232 help to align the shunt ring 246 and the magnets 240 as they are slid into place on the shell 230, and also help to strengthen the shell 230. The gaps 242 are filled by the dividers 234 (some of which are also aligned with the ribs 232) once the magnets 240 are installed in the magnet compartment 233.

As shown in FIG. 2-4, the magnetic latch assembly 220 further comprises ramp-and-hook latches 250. Specifically, in some examples, the ramp-and-hook latches 250 are formed as part of the same material (i.e., integral with) the shell 231, specifically an outer wall of the magnet compartment 233. In other examples, the ramp-and-hook latches 250 may be separate parts that are coupled to the shell 231. As shown in the FIG. 2-4, each of the ramp-and-hook latches 250 comprises a ramp 251 and a hook 252. Moreover, the ramp-and-hook latches 250 are distributed evenly around the circumference of the shell 231. In the example of FIGS. 2-4, there are four ramp-and-hook latches 250_1 to 250_4 illustrated, but any number may be provided in other examples. As shown in FIG. 2-4, each of the hooks 252 comprises a protruding portion 252a which protrudes in a circumferential direction from an apex of the ramp-and-hook latch 250, a sloped lead-in surface 252b on an end of the protruding portion 252b, and a cove 252c defined by and located behind the protruding portion (to avoid obscuring the figures, the parts 252a, 252b, and 252c are labeled for only one hook 252 in FIGS. 2-4, but are present for all of the hooks 252). The ramp 234 extends also extends circumferentially from the apex of the ramp-and-hook latch 250, but in an opposite direction from the hook 252 and the ramp slopes back towards the rear of the magnet compartment 233 until terminating at the cove 252c defined by the hook 252 of an adjacent latch 250. For example, as shown in FIG. 2, the ramp 251 of the latch 250_2 begins at the apex near the hook 252 of the latch 250_2 and then extends circumferentially back towards the latch 250_1, sloping rearwards along the way, until terminating at the hook of the latch 250_1.

The shell 231 further comprises a front mating surface 235. This front mating surface 235 faces and engages with a corresponding mating surface of the shell 331 of another coupling member 300 to which the coupling member 200 is coupled, as will be describe in greater detail below. In the example illustrated in FIGS. 2-4, the latches 250 are recessed axially relative to the front mating surface 235. In other examples, the latches 250 may protrude axially relative to this surface.

In FIGS. 2 and 3, the secondary connection portion 216 is shown as a threaded fitting, but it should be understood that this is merely one example and that any type of fitting could be used for the secondary connection portion 216, such as any of those fittings described above in relation to the connection portion 116.

The female coupling interface 212 of the main coupling body 210 may comprise a receptacle 213 into which a complementary main coupling interface 312 of another fluid coupling 300 may be received. Inside the coupling interface 312, additional components (not illustrated) may be housed, such as flow control elements as described above.

The operation of various features of the fluid coupling 200 will be described in greater detail below with reference to FIGS. 9-14 after the description of the fluid coupling 300.

Figure 7:
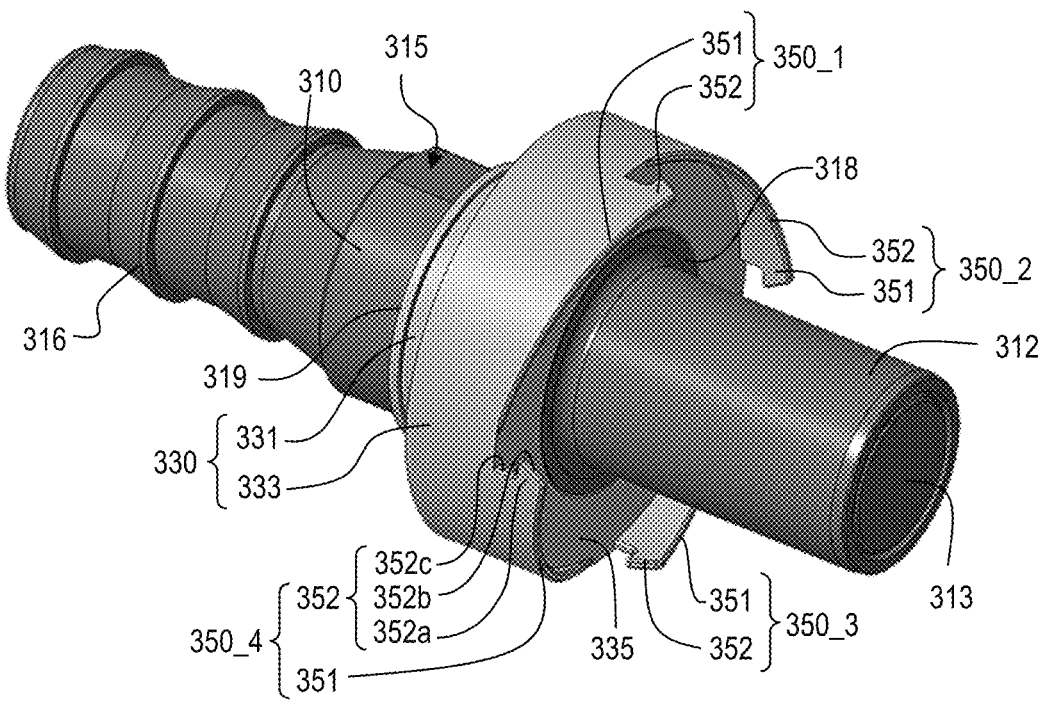
FIG. 7 is a perspective view of an example third fluid coupling.
Figure 8:
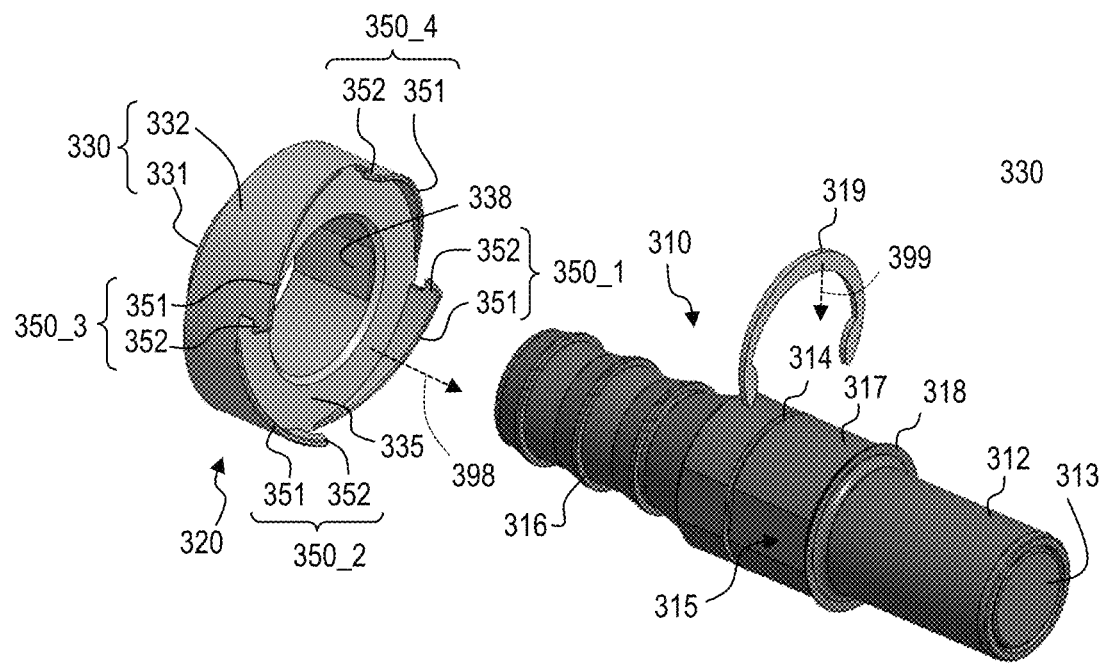
FIG. 8 is an exploded perspective view of the third fluid coupling.

FIGS. 7 and 8 illustrate a fluid coupling 300. The fluid coupling 300 is configured to couple with the fluid coupling 200 described above, and thus comprises a male coupling interface 312 configured to mate with (i.e., be received in) the female coupling interface 212 of the fluid coupling 200. In particular, the fluid coupling 300 comprises a main coupling body 312, which comprises the male coupling interface 312 and a secondary connection portion 316. In the illustrated example, the secondary connection portion 316 comprises a hose barb connection, but any other type of connection or fitting may be used. The fluid coupling 300 also comprises a magnetic latch assembly 320 similar to the magnetic latch assembly 220 described above, with a few differences explained below and visible in the figures.

As shown in FIG. 8, the main coupling body 310 also comprises a central portion 317, which is disposed between the male coupling interface 312 and the secondary connection portion 316. Or the central portion 317 may be regarded as being part of the coupling interface 312. In either case, the magnetic latch assembly 320 is coupled to the central portion 317 such that the coupling interface 312 (or at least a portion thereof) protrudes axially beyond the magnetic latch assembly 320. This protruding portion of the coupling interface 312 is configured to be received within the coupling interface 212.

More specifically, the magnetic latch assembly 320 comprises a shell 330, which comprises an inner cylinder 331 and a magnet compartment 332, and the inner cylinder 331 is moved in the direction of the arrow 398 onto the central portion 317 to mount the magnetic latch assembly 320 to the main coupling body 310. In the assembled position, the inner cylinder 331 is positioned radially outward from, and circumferentially surrounds the central portion 317. Moreover, as shown in FIGS. 7 and 8, the main coupling body 310 also comprises a flange 318 between the central portion 317 and the protruding portion of the coupling interface 312. This flange 318 interferes with (i.e., contacts and blocks) the inner cylinder 331, preventing the magnetic latch assembly 320 from moving axially in the direction 398 beyond the flange 318. A snap retention ring 319 may be inserted into a groove 314 in the central portion 317 of the main coupling body 310 to prevent the magnetic latch assembly 320 from moving axially in the direction opposite direction 398. Thus, the ring 319 and the flange 318 together constrain the axial movement of the magnetic latch assembly 320 relative to the main coupling body 310. In this case, the ring 319 does not need to pass through a slot in the inner cylinder 331 because the ring 319 does not need to control motion of the magnetic latch assembly 320 in the direction 398, as this is already controlled by the flange 318. This is in contrast to the fluid coupling 200, wherein the ring 219 is responsible for constraining motion in both axial directions.

The shell 230 of the magnetic latch assembly 320 also comprises a magnet compartment 332. Like the magnet compartment 232 described above, the magnet compartment 332 comprises multiple sub-compartments (not visible, but similar to compartments 236) separated by dividers (not visible, but similar to dividers 234) that each receive a magnet (not visible, but similar to magnets 240). The magnets of the magnetic latch assembly 320 may be identical to the magnets 240 described above, and thus are not shown separately herein. The magnetic latch assembly 320 may further comprise a steel shunt ring (not visible) similar to the shunt ring 245 described above.

Like the magnetic latch assembly 220, the magnetic latch assembly 320 comprises ramp-and-hook latches 350. These ramp-and-hook latches 350 comprise ramps 351 and hooks 352 (which may comprise a protrusion 352a, a sloped lead-in surface 352b, and cove 352c), similar to the ramp-and-hook latches 250 described above. However, unlike the ramp-and-hook latches 250, the ramp-and-hook latches 350 protrude axially in the direction 398 beyond the front engagement face 335 of the magnetic latch assembly 320. This allows the ramp-and-hook latches 350 to extend partially over portions of the fluid coupling 200 during coupling so as to engage with the complementary ramp-and-hook latches 250 thereof.

As shown in FIG. 8, the central portion 317 comprises flat surfaces 315 and the shell comprises corresponding flat surfaces 338, and like the counterparts described above these flat surfaces engage one another to prevent rotation of the magnetic latch assembly 320 relative to the main coupling body 310.

The male coupling interface 312 further comprises a flow control element 313, which blocks the flow of liquid therethrough. This flow control element 313 may engage with a portion of the female coupling interface 212 as the male coupling interface 312 is inserted therein and this may cause the flow control element 313 to be pushed in a direction opposite the direction 398, which may open the flow control element 313 and allow liquid to begin flowing. A similar flow control element (not visible) in the female coupling interface 212 may be engaged by the male coupling interface 312 to open that flow control element.

Turning now to FIGS. 9-14, a sequence of coupling the fluid coupling 200 with the fluid coupling 300 will be described.

Figure 9:
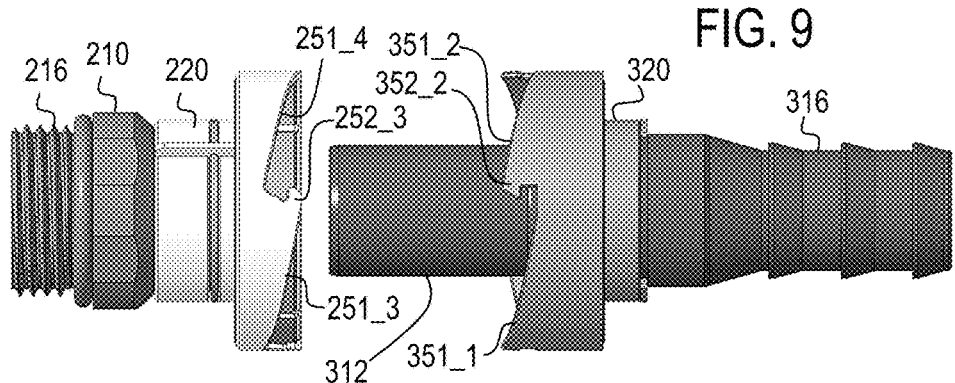
FIG. 9 is a side view of the second and third fluid couplings in a first state of a coupling sequence.

FIG. 9 illustrates a first state in which the fluid couplings 200 and 300 are aligned with one another in preparation for coupling, but have not yet contacted one another. In this state, there are no forces resisting the coupling of the fluid couplings 200 and 300 because they are not yet in contact.

Moreover, the magnets 240 of the magnetic latch assemblies 220 and 320 may be very slightly attracting one another in this state, but because they are relatively distant the attraction forces are very small.

Figure 10:
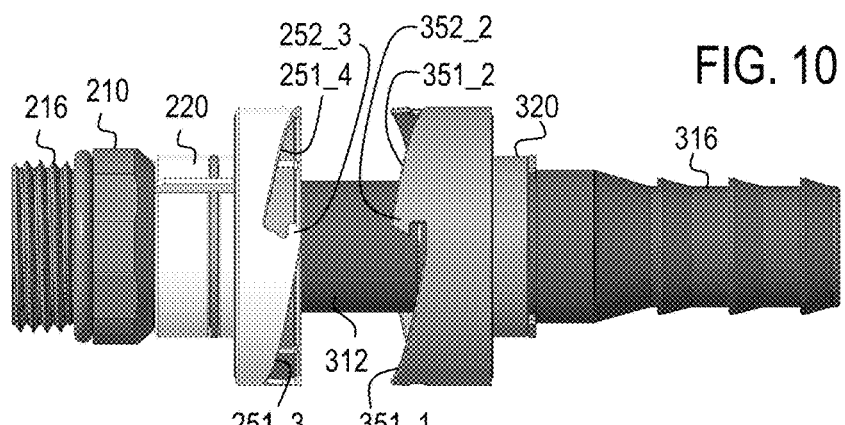
FIG. 10 is a side view of the second and third fluid couplings in a second state of a coupling sequence.

FIG. 10 illustrates a second state in which the male coupling interface 312 has been inserted partway into the female coupling interface 212. In this state, the internal springs of the coupling interface 212 and 312 will only be compressed a small amount and thus there will be a moderate amount of force resisting the coupling, with some coming from the spring forces and some coming from the liquid pressure in the couplings (assuming they are connected to pressurized lines). In some examples, the amount of force resisting coupling at this stage may be around 10-20 lbs (22-89 N). Moreover, the magnets of the magnetic latch assemblies 220 and 320 may be close enough to each other at this stage to start contributing a non-negligible amount of magnetic attraction force, for example around 5-10 lbs (22-44 N). Thus, a net force that a user may need to supply to continue moving the couplings 200 and 300 together may be around 5-10 lbs (22-44 N). Moreover, at this stage the magnets begin urging the magnetic latch assemblies 220 and 320 to self-align with one another, such that corresponding pairs of the hooks 252 and 352 are in line with one another.

Figure 11:
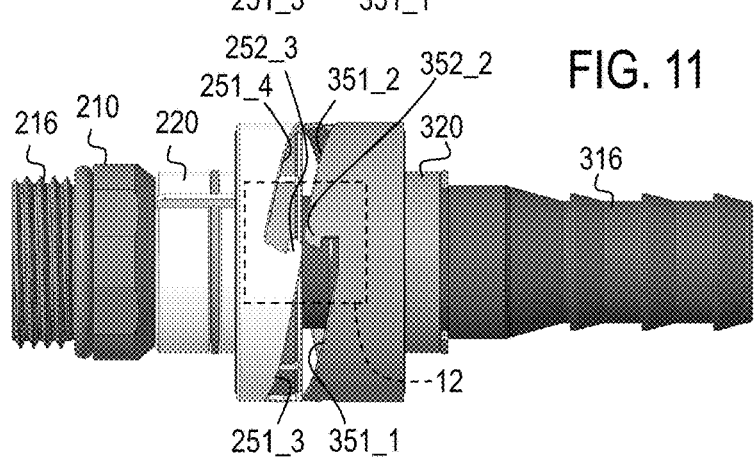
FIG. 11 is a side view of the second and third fluid couplings in a third state of a coupling sequence.

FIG. 11 illustrates a third state in which the male coupling interface 312 has been farther into the female coupling interface 212. In this state, the internal springs of the coupling interface 212 and 312 will have been compressed almost fully and thus there will be a large amount of force resisting the coupling (again, in part due to the springs and in part to pressure). In some examples, the amount of force resisting coupling at this stage may be around 20-30 lbs (89-133 N). Moreover, the magnets of the magnetic latch assemblies 220 and 320 are much closer now, and thus their magnetic attraction force is much greater, for example around 15-25 lbs (67-111 N). Thus, a net force that a user may need to supply to continue moving the couplings 200 and 300 together remains around 5 lbs (22 N). Moreover, at this stage the magnets are strongly forcing the magnetic latch assemblies 220 and 320 into self-alignment.

Figure 12:
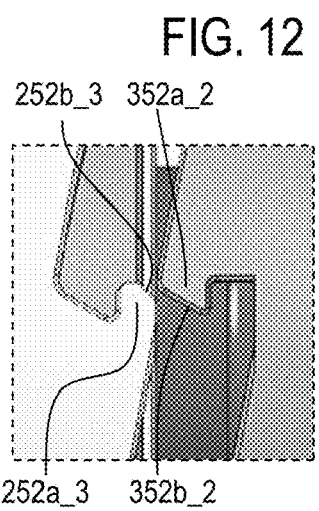
FIG. 12 is an enlarged view of the region 12 in FIG. 11.

Furthermore, in the state illustrated in FIG. 11, the hooks 252 and 353 are about to contact one another. As shown in the enlarged detail view of FIG. 12, the self-alignment of the magnetic latch assemblies 220 and 320 causes the hooks 252 and 352 to align with one another such that, when they collide, the sloped lead-in surface 252b of one hook 252 engages with the sloped lead-in surface 352b of the opposing hook 352. For example, as shown in FIG. 12 the sloped lead-in surface 252b_3 is about to engage with the sloped lead-in surface 352b_2. This engagement between the lead-in surfaces 252b and 352b causes the magnetic latch assemblies 220 and 320 to rotate slightly relative to one another as they continue to move axially toward one another.

Figure 13:
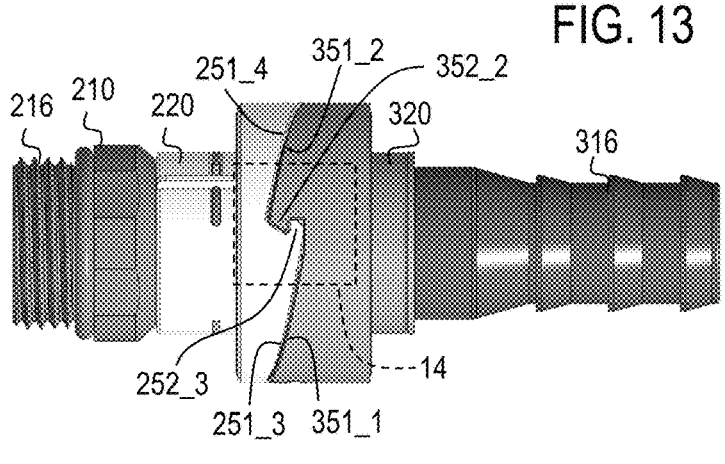
FIG. 13 is a side view of the second and third fluid couplings in a fourth state of a coupling sequence.

FIG. 13 illustrates a fourth state in which the male coupling interface 312 has been fully inserted into the female coupling interface 212. In this state, the internal springs of the coupling interface 212 and 312 will have been compressed fully and thus the largest force resisting the coupling will be presented. In some examples, the amount of force resisting coupling at this stage may be around 40-50 lbs (178-222 N). Moreover, the magnets of the magnetic latch assemblies 220 and 320 are nearly touching (e.g., approximately 1-2 mm separation), and thus their magnetic attraction force is at its maximum, for example around 40-50 lbs (178-222 N). Thus, a net force that a user may need to supply to bring the couplings 200 and 300 into this state, and/or the force that is needed to hold them there, is from 0-5 lbs (0-22 N).

Figure 14:
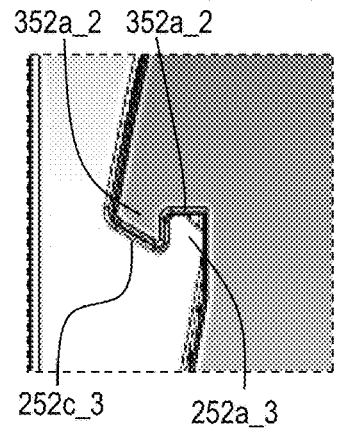
FIG. 14 is an enlarged view of the region 14 in FIG. 13.

Moreover, as shown in FIG. 14, as the hooks 252 and 352 pass one another, the strong self-aligning forces provided by the magnets cause the hooks 252 and 352 to snap back into axial alignment (i.e., the magnetic latch assemblies 220 and 320 rotate back into alignment), except now the hooks 252 and 352 will be interlocked. That is, the protruding portion 352a of each hook 352 will be disposed behind the protruding portion 252a of the corresponding hook 252, with the protruding portion 352a inside the cove 252c defined by the hook 252, and vice versa. For example, as shown in FIG. 14, the protruding portion 352a_2 is disposed in the cove 252c_3 and the protruding portion 252a_3 is disposed in the cove 352a_2, thus interlocking the hooks 252_3 and 352_2. In addition, if the hooks 252 and 352 have not fully returned to alignment and interlocked with one another by the time that the ramps 251 and 351 engage with one another, the engagement between the ramps 251 and 351 together with the axial pull of the magnets may cause the rotation of the magnetic latch assemblies 220 and 320 that is needed to cause the engagement.

In the latched state shown in FIGS. 13 and 14, the hooks 252 and 352 can hold the fluid couplings 200 and 300 coupled together. In some cases, the magnetic attraction forces may slightly exceed the forces resisting coupling, and the latching of the hooks 252 and 352 may be used as a backup or secondary means of ensuring the fluid couplings 200 and 300 stay coupled. Such a backup latching may be prudent, for example, to guard against events such as accidental bumps or pressure spikes that could upset the balance of forces and cause the repulsion forces to temporarily exceed the magnetic attraction forces. In such a case, if the magnets were solely relied upon to latch the couplings 200 and 300, the fluid couplings 200 and 300 may come apart, causing leaks. In addition, in some cases the magnetic attraction forces might not exceed the forces resisting coupling. That is, in some cases the magnetic attraction force might aid in reducing the force needed to couple the fluid couplings 200 and 300 but the repulsive force may nevertheless exceed the magnetic attraction force when fully coupled, in which case the hooks 252 and 352 become the primary means of securing the fluid couplings 200 and 300 together.

Figure 15:
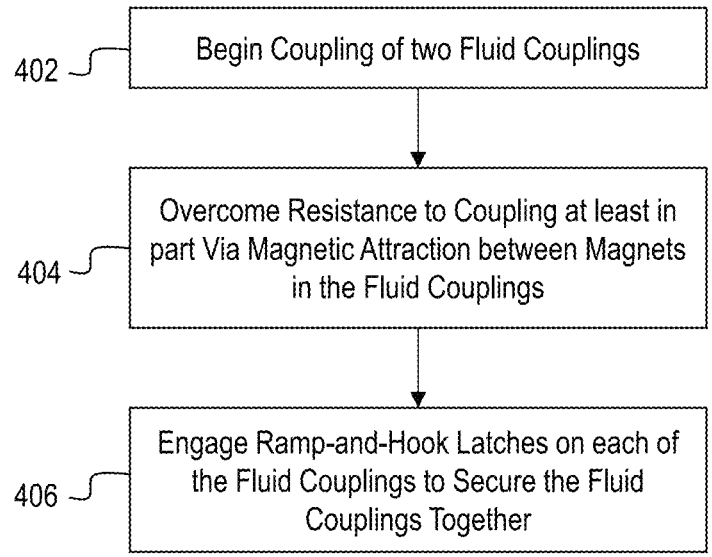
FIG. 15 is a process flow diagram illustrating an example method.

Turning now to FIG. 15, a method 400 will be described. Method 400 may be performed, for example, by a technician or other person who is coupling two fluid couplings together, such as two of the fluid couplings 100, 200, and/or 300 described above.

Block 402 comprises beginning the coupling of the two fluid couplings, for example by inserting a male coupling interface of one fluid coupling into a female coupling interface of the other fluid coupling.

Block 404 comprises overcoming resistance to the coupling of the two fluid couplings at least in part by the assistance of magnetic attraction forces generated by magnets included in the fluid couplings. More specifically, in some examples, the magnets are provided in magnetic latch assemblies removably attached to main coupling bodies of the fluid couplings, wherein the magnetic latch assemblies comprise plastic shells that house the magnets.

Block 406 comprises engaging ramp-and-hook latches on each of the fluid couplings with one another to secure the fluid coupling together. In some examples, the ramp-and-hook latches are part of the magnetic latch assemblies, specifically part of the plastic shells in some examples.

Engaging the ramp-and-hook latches may comprise interlocking hooks of each pair of complementary ramp-and-hook latches, and also engaging corresponding ramps of each pair of ramp-and-hook latches.

Figure 16:
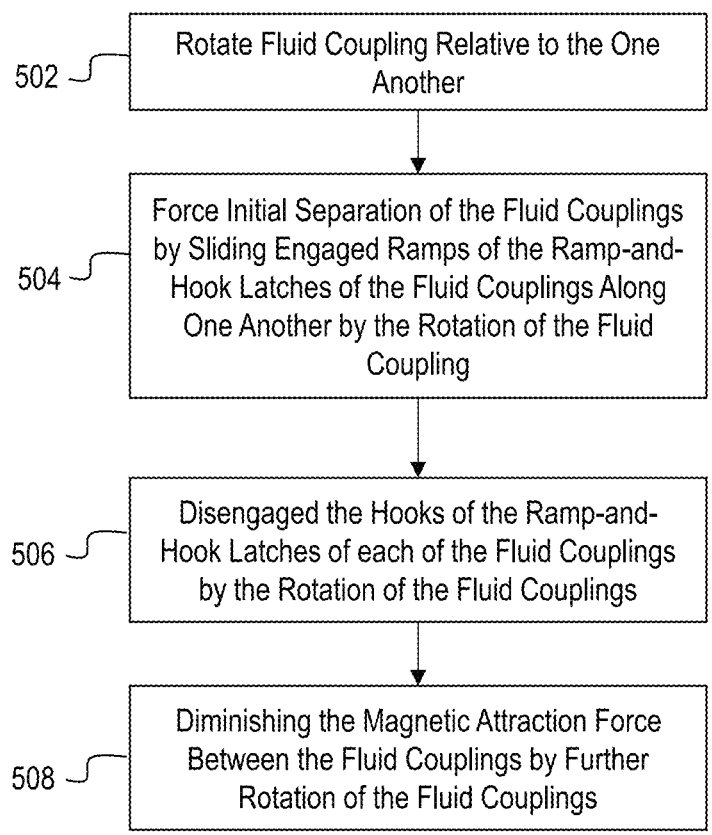
FIG. 16 is a process flow diagram illustrating another example method.

FIG. 16 illustrates a method 500 will be described. Method 500 may be performed, for example, by a technician or other person who is decoupling two fluid couplings together, such as two of the fluid couplings 100, 200, and/or 300 described above.

Block 502 comprises rotating the fluid couplings relative to one another by a first amount. The amount may be a relatively small amount, such as a few degrees.

Block 504 comprises forcing an initial separation of the fluid couplings in the axial direction by sliding pairs of ramps along one another by the rotation of block 502, wherein the ramps that slide along one another each comprise a ramp from a ramp-and-hook latch disposed on one of the fluid couplings and another ramp from another complementary ramp-and-hook latch disposed on the other one of the fluid couplings.

Block 506 comprises disengaging the hooks of each pair of the complementary ramp-and-hook latches by the rotation of block 502, wherein for each pair of complementary ramp-and-hook latches, the hooks thereof were interlocked with one another prior to the rotation of block 502.

Block 508 comprises diminishing the magnetic attraction force between the fluid couplings by further rotation of the fluid couplings beyond the first amount. In some examples, block 508 may further comprise, in response to diminishing the magnetic attraction force between the fluid couplings, decoupling the fluid couplings from one another.

Figure 17:
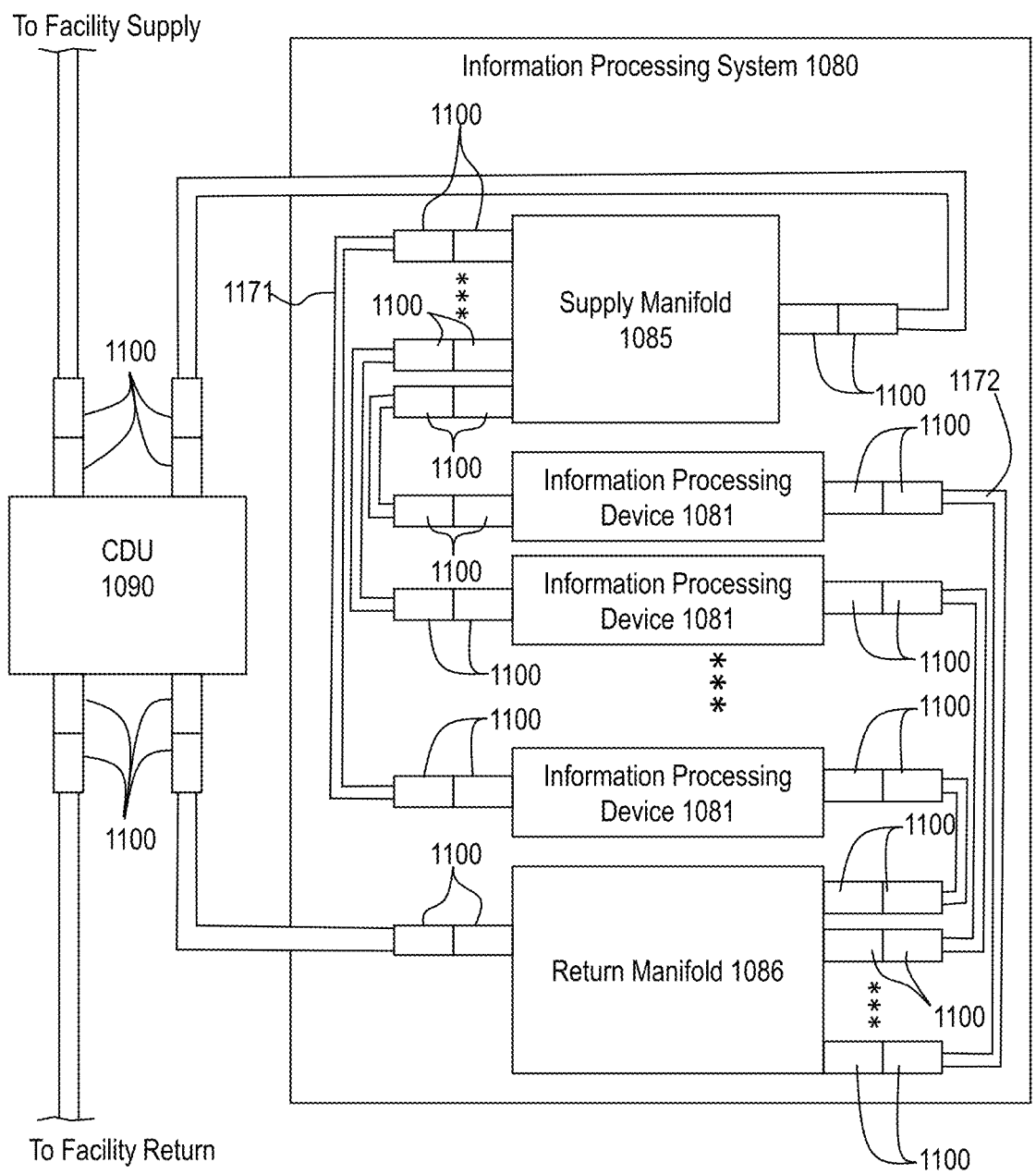
FIG. 17 is a block diagram illustrating an example system comprising a computer system with fluid couplings.

Turning now to FIG. 17, an example system 1000 is described. The system 1000 may comprise one or more computer systems 1080. In FIG. 17, one computer system 1080 is illustrated, but any number may be provided in other examples. In FIG. 17, the computer system 1080 is shown as a multi-node computer system which comprises a plurality of compute nodes 1081. Each compute node 1081 may be, for example, a server, a sever node, a blade of a blade server, or any other computing device. In other examples, one or more (in some cases all) of the compute nodes 1081 may be replaced by other electronic devices, such as networking devices, power supply units, or other electronic devices. Although the computer system 1080 is shown as a multi-node system, in other examples the computer system 1080 may comprise a single computing device, such as a single compute node 1080.

The computer system 1080 is a liquid cooled system. Thus, the compute nodes 1081 (and/or other electronic devices of the system 1080) may be configured to receive a supply of liquid coolant from a cooling system and to return heated liquid coolant thereto. Liquid lines such as liquid supply lines 1171 and liquid return lines 1172 may be coupled to the compute nodes 1081 to supply and return the liquid coolant. Some of all of these liquid lines may be coupled to the compute nodes 1081 and/or to other components via QD fluid couplings 1100. For example, in the illustrated examples each compute node 1081 has a QD fluid coupling 1100 attached thereto and another QD fluid coupling 1100 is coupled with the first QD fluid coupling 1100. Some or all of these QD fluid couplings 1100 may be any of the fluid couplings 100, 200, and/or 300 described above. For example, in some implementations the fluid couplings 200 may be used as the QD fluid couplings 1100 that are coupled to the compute nodes 1081 and the fluid couplings 300 may be used as the QD fluid couplings 1100 that are coupled to the supply and return lines 1171 and 1172.

In some examples, the supply lines 1171 are coupled to additional liquid cooling infrastructure, such as a supply manifold 1085 and a coolant distribution unit (CDU) 1090. Similarly, the return lines 1172 may be coupled to additional liquid cooling infrastructure, such as a return manifold 1086 and the CDU 1090. The CDU 1090 may comprise one or more pumps that generate the flows of liquid coolant, which flow in a loop from the CDU 1090 to the compute nodes 1081 (via the supply manifold 1085) and then back to the CDU 1090 (via the return manifold 1086). In addition, the CDU 1090 may comprise a heat exchanger arranged to cool the liquid coolant by transferring heat from the liquid coolant to another cooling medium, such as a facility-wide cooling medium. In this way, the liquid coolant provided by the CDU 1090 to the compute nodes 1081 can be relatively cool (thus allowing for more efficient heat removal from electronic devices), the coolant is then heated by the compute nodes 1081 and the heated liquid coolant is returned to the CDU 1090, and then the CDU 1090 cools the heated liquid coolant and supplies the now-cooled liquid coolant back to the compute nodes 1081 for another cycle. The facility-wide cooling medium that removes the heat from the liquid coolant in the CDU 1090 may be air (e.g., the CDU 1090 may comprise a liquid-to-air heat exchanger, such as a radiator) or liquid (e.g., the CDU 1090 may comprise a liquid-to-liquid heat exchanger). In FIG. 17, the CDU 1090 is shown as being coupled to facility supply and facility return liquid for liquid-to-liquid heat exchange, but this is just one example.

In some examples, the couplings between the supply manifold 1085 and supply lines 1071 comprise QD fluid couplings 1100. Similarly, in some examples, the couplings between the return manifold 1086 and the return lines 1072 comprise QD fluid couplings 1100. Furthermore, in some examples, the couplings between the supply manifold 1085 and the CDU 1090 comprise QD fluid couplings 1100. Similarly, in some examples, the couplings between the return manifold 1086 and the CDU 1090 comprise QD fluid couplings 1100. Furthermore, in some implementations in which the CDU 1090 is coupled to facility liquid supply or returns, the connections between the CDU 1090 and the facility lines may comprise QD couplings 1100. In the various aforementioned examples, some or all of these QD fluid couplings associated with the supply or return manifolds 1085 and 1086 and/or the CDU 1090 may be one of the fluid couplings 100, 200, and/or 300 described above. For example, in some implementations the fluid couplings 200 may be used as the QD fluid couplings 1100 that are coupled to the manifolds 1085 and 1086 and/or the CDU 1090, and the fluid couplings 300 may be used as the QD fluid couplings 1100 that are coupled to the fluid lines coupled thereto.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within +1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. A fluid coupling for liquid cooling of electronic devices, comprising:
    a main coupling body comprising a coupling interface configured to couple with a complementary coupling interface of a second fluid coupling; and
    a magnetic latch assembly coupled to the main coupling body and comprising:
        a shell;
        a plurality of magnets housed in the shell;
        a plurality of ramp-and-hook latches coupled to the shell and arranged to engage with complementary ramp-and-hook latches of a second magnetic latch assembly coupled to the second fluid coupling.

2. The fluid coupling of claim 1,
    wherein each of the ramp-and-hook latches comprises a hook configured to interlock with a corresponding complementary hook of the complementary ramp-and-hook latches of the second magnetic latch assembly.

3. The fluid coupling of claim 2,
    wherein each of the hooks comprises a protruding portion and a cove defined behind the protruding portion, wherein in the interlocked state of a given hook of the plurality of ramp-and-hook latches with the corresponding complementary hook, the protruding portion of the given hook is received within a cove of the corresponding complementary hook and a protruding portion of the corresponding complementary hook is received within the cove of the give hook.

4. The fluid coupling of claim 2,
    wherein the magnets are arranged so as to cause self-alignment of the magnetic latch assembly relative to the second magnetic latch assembly in a partially coupled state such that the hooks are axially aligned with corresponding complementary hooks.

5. The fluid coupling of claim 4,
    wherein each of the hooks comprises an angled lead-in surface, wherein during coupling of the fluid coupling with the second fluid coupling, the angled lead in surfaces of the hooks are aligned with and collide with complementary angled lead in surfaces of the hooks the second magnetic latch assembly.

6. The fluid coupling of claim 2,
    wherein each of the ramp-and-hook latches comprises a ramp extending from the hook of the respective ramp-and-hook latch and sloping back towards a rear of the shell.

7. The fluid coupling of claim 6,
wherein the ramp of a given ramp-and-hook latches extends from the hook of the given ramp-and-hook latch to the hook of an adjacent ramp-and-hook latch.

8. The fluid coupling of claim 6,
wherein the ramps of the ramp-and-hook latches are configured to engage with corresponding complementary ramps of the second magnetic latch assembly such that, in response to rotation of the fluid coupling and the second fluid coupling in a coupled state, the ramps slide relative to the corresponding complementary ramps and force axial translation of the fluid coupling relative to the second fluid coupling.

9. The fluid coupling of claim 1,
wherein the shell is plastic.

10. The fluid coupling of claim 1,
wherein the plurality of magnets comprise ring segments collectively forming a ring encircling the main coupling body with the magnets arranged with alternating polarities.

* * * * *